United States Patent [19]
Bartley et al.

[11] Patent Number: 6,084,775
[45] Date of Patent: Jul. 4, 2000

[54] HEATSINK AND PACKAGE STRUCTURES WITH FUSIBLE RELEASE LAYER

[75] Inventors: Gerald K. Bartley, Rochester; Douglas A. Baska, Oronoco; James D. Bielick, Pine Island; Matthew A. Butterbaugh, Rochester; Mark K. Hoffmeyer, Rochester; Sukhvinder Singh Kang, Rochester, all of Minn.

[73] Assignee: International Business Machines Corporation, Armonk, N.Y.

[21] Appl. No.: 09/207,785

[22] Filed: Dec. 9, 1998

[51] Int. Cl.[7] .................................................. H05K 7/20
[52] U.S. Cl. .......................... 361/705; 361/704; 361/706; 361/707; 361/708; 361/709; 361/717; 361/718; 361/719; 257/706; 257/707; 257/717; 257/722; 165/80.3; 174/16.3
[58] Field of Search ...................................... 361/704, 705, 361/706, 707, 708, 709, 710, 717, 718, 719; 257/675, 706, 707, 712, 713, 717–719, 721, 722; 174/16.3; 165/80.3, 80.4, 80.2, 185

[56] References Cited

U.S. PATENT DOCUMENTS

| | | | |
|---|---|---|---|
| 3,686,539 | 8/1972 | Schwartzman | 257/745 |
| 3,996,548 | 12/1976 | Chaffin, III | 338/15 |
| 4,034,469 | 7/1977 | Koopman et al. | 29/825 |
| 4,817,854 | 4/1989 | Tihanyi et al. | 228/124.1 |
| 5,012,858 | 5/1991 | Natori et al. | 165/80.4 |
| 5,247,203 | 9/1993 | Shigihara et al. | 257/713 |
| 5,396,403 | 3/1995 | Patel | 361/705 |
| 5,422,788 | 6/1995 | Heinen et al. | 361/705 |
| 5,430,611 | 7/1995 | Patel et al. | 361/705 |
| 5,587,882 | 12/1996 | Patel | 361/705 |
| 5,601,675 | 2/1997 | Hoffmeyer et al. | |
| 5,724,729 | 3/1998 | Sherif et al. | 29/840 |
| 5,769,989 | 6/1998 | Hoffmeyer et al. | |
| 5,821,612 | 10/1998 | Kitagawa | 257/675 |
| 5,907,474 | 5/1999 | Dolbear | 361/705 |
| 5,912,805 | 6/1999 | Freuler et al. | 361/705 |

FOREIGN PATENT DOCUMENTS

| | | |
|---|---|---|
| 356 120 125 | 9/1981 | Japan . |
| 356 042 394 | 6/1987 | Japan . |
| 6 213 155 | 6/1987 | Japan . |

*Primary Examiner*—Leo P. Picard
*Assistant Examiner*—Boris G. Chervinsky
*Attorney, Agent, or Firm*—James E. Bradley

[57] ABSTRACT

Aluminum heatsinks are plated with a solderable layer and are overplated with a solder release layer. The release layer comprises a tin-lead-indium alloy. The heatsinks are mounted on individual IC modules or banks of IC modules that are interconnected to a printed circuit card. A mechanically compliant, thermally conductive adhesive is used to join the heatsinks to the modules. An oxide formed on the release layer readily bonds with the thermally conductive adhesive. In the event that heatsinks need to be removed to repair or rework the modules, local heat may be applied to melt the release layer to remove a heatsink without need for use of significant applied torque and normal forces. Because the release layer has a low melting point that affords easy separation from the adhesive layer, both component delaminations and the partial reflow or melting of solder joints on adjacent components are eliminated from the heatsink removal process.

35 Claims, 2 Drawing Sheets

HEATSINK AND PACKAGE STRUCTURES WITH FUSIBLE RELEASE LAYER

TECHNICAL FIELD

This invention relates in general to cooling integrated circuit modules and in particular to a heatsink structure with a fusible release layer for mounting to an integrated circuit module.

BACKGROUND ART

Single Chip Modules (SCMs) and Multi-Chip Modules (MCMs) used to package Integrated Circuit chips (ICs) for a variety of electronics applications are well known in the art. In applications where significant amounts of heat are generated during operation of SCM or MCM devices, secondary external cooling hardware must be attached to the modules to provide optimum performance and reliability during operation. To ensure development of low thermal resistance pathways at interfaces between modules and heatsinks, a common method for cooling SCMs and MCMs is to attach aluminum heatsinks to module surfaces, module lids, or directly to surfaces of one or more of the chips present on the modules. In any of these configurations, optimum cooling efficiency and desired mechanical properties of the module to heatsink interface are provided by using a thin layer of low thermal resistance, thermally conductive, compliant adhesive to bond the heatsink to a given module or device surface or surfaces on the module. In this specification, the term compliant is defined as the ability of an adhesive to absorb or take up mechanical stresses between the adhesive and the bonded surfaces.

However, in many applications, including the use of SCMs and MCMs in high performance computers, both modules and interconnecting printed circuit boards (PCBs) are very expensive, and can be fairly restricted in supply. As a consequence of these expense and supply constraints, attached heatsinks used for improved cooling performance must also be removable from either module or chip surfaces, so that repair and reuse of the PCBs, modules, and heatsinks is possible. In order to facilitate heatsink removal to accommodate subsequent electronics hardware reuse and repair, it is desirable to bond heatsinks to modules using a thermally conductive adhesive that softens upon local heating of module and module site on the PCB. After external heat is applied, removal of the heatsink is achieved by using both applied torque (twisting) and vertical tensile (pulling) forces. Simultaneous application of these forces results in "taffy pull" stretching and eventual cohesive or interfacial bond failure of the adhesive, and allows for complete separation of the heatsink from the module. After the heatsink is removed, any residual adhesive on module, chip, or heatsink bond surfaces is removed with either chemical or mechanical methods, thus allowing the heatsink, the module, and the circuit board to be either repaired or reclaimed for potential reuse.

Unfortunately, in certain applications, use of the aforementioned adhesive heatsink attach structure and rework methodology is inadequate. For example, when large heat dissipation requirements are necessary, the intrinsic thermal conductivity of the attach adhesive limits the application thickness of the adhesive that can be used to provide a low thermal resistance interface that effectively transfers heat generated from the operating module to the heatsink. In this case, control of variables that affect both the ability to apply a thin adhesive bond line and the ability to control the resultant thickness of the attach adhesive after the heatsink is placed in contact with the module become critical to ensure in-service reliability of the module IC devices. If the adhesive layer is applied too thick, or is too thick or inconsistent in thickness after heatsink attach, overheating can result and prompt latent in-service module IC device failures. Potential for excess adhesive thickness is most pronounced in packaging configurations where a single heatsink is directly attached to multiple chip surfaces of a MCM. For this application, both flatness of IC chip attach surfaces and relative planarity of the module IC chips with respect to one another as attached on the MCM module surface are critical to ensure both identical and minimal adhesive layer thickness results at the interfaces between all IC chips and the bond surface of the heatsink after it has been attached to the module. However, since planarity of the chips cannot be guaranteed to less than 0.010 inches without use of costly alternative finishing methods such as mechanical IC chip backside lapping, the potential for both excessive and significantly inconsistent adhesive interface bond layer thicknesses can exist at one or more IC device locations. Therefore, as shown in FIG. 1, a separate heatsink 11 must be used on each chip 13 of module 15 since the outer surfaces of chips 13 are not co-planar, and to provide thin adhesive layers of consistent thickness.

Although adhesive thickness and thickness variation can be minimized by using independent multiple heatsinks on MCMs, the presence of multiple heatsinks in package designs drives other problems when used with the prior art heatsink design and attach methodology. These problems can include both heat dissipation uniformity resulting from heatsink placement variation on the module, and heatsink removal constraints imposed by the geometry of the heatsinks required for the packaging application. To ensure uniform heat dissipation, the heatsinks must be in very close proximity to provide consistent module coverage and heatsink cooling fin spacing. However, when independent heatsinks having square or rectangular base geometries are required to be uniformly close to one another, mechanical interference between adjacent heatsinks can occur during the removal operation. This mechanical interference inhibits the ability to apply adequate torque to remove the individual heatsinks from the modules. Thus, the use of separate heatsinks does not allow for completely effective module rework and removal when used in conjunction with the prior art attach configuration.

In other applications, such as the section of PCB assembly shown in FIG. 2, a PCB 21 has multiple IC modules 23 on both of its surfaces or sides. Card 21 requires both individual heatsinks 25a, that provide heat dissipation for individual modules, and individual array heatsinks 25b that provide for cooling of banks or arrays of two or more modules 23 that are clustered in closely spaced groups on the card surfaces. Modules on both sides of the PCB require heatsinks to adequately cool the hardware and ensure reliability. Heatsinks 25b and their modules 23 are typically held together with retention pins 27 which extend through large holes in card 21. Heatsinks 25b provide cooling of non-planar module surfaces through the use of a compliant, thermally conductive pad 29 affixed between each heatsink 25b and their modules 23. In addition, heatsinks 25b may be removed for rework by removing pins 27.

Although heatsinks 25a, 25b of in FIG. 2 are easily removed, the design has three disadvantages. First, space required for the retention pin holes in the card compromise card wireability. Second, the thermal pads offer inferior thermal performance compared to direct bond conductive adhesives. Finally, the dual-side array heatsink assembly is relatively expensive.

To overcome these shortcomings, attempts have been made to bond large array heatsinks to the module banks using the previously described conductive adhesive bonding approach for direct heatsink attachment. Unfortunately, heating the card and heatsink assembly followed by "taffy pull" heatsink removal delaminates the copper module attach pads on the PCB. In some cases, entire banks of modules and corresponding copper attach pads on the PCB can be inadvertently removed from the card surfaces. Thus, adhesive bonding approaches do not consistently support card rework.

An alternative interconnect method for reworking and replacing wirebonded chips attached to carrier surfaces is described in U.S. Pat. Nos. 5,601,675 and 5769,989. The method may be generally summarized as follows and is depicted in FIG. 3. A fusible release layer 31 such as solder is applied between a chip carrier pad 39 and a wirebond technology chip 35 present on a carrier surface 33. The chip 35 is bonded to release layer 31 with a layer of adhesive 37.

With this method, rigid adhesives that are in general not effectively reworkable by thermal softening or chemical or mechanical means are used to ensure high yield wirebonding. Local heat is applied immediately around chip 35 to melt the release layer 31 beneath the chip bond adhesive 37, thereby allowing for clean separation of both chip 35 and adhesive 37 from the chip carrier pad 39 on the carrier surface 33. A new chip is then bonded at the vacant site with fresh adhesive, followed by curing and subsequent electrical attachment. The release layer has a melting temperature which is compatible with wirebond process temperature requirements and other reflow assembly operations to ensure structural stability. A modified version of this method could be used to removably secure heatsinks to IC modules.

DISCLOSURE OF THE INVENTION

Aluminum heatsinks are plated with a solderable layer and are overplated with a solder release layer. The release layer comprises a tin-lead-indium alloy. The heatsinks are mounted on individual IC modules or banks of IC modules that are interconnected to a printed circuit card. A mechanically compliant, thermally conductive adhesive is used to join the heatsinks to the modules. An oxide formed on the release layer readily bonds with the thermally conductive adhesive.

In the event that heatsinks need to be removed to repair or rework the modules, local heat may be applied to melt the release layer to remove a heatsink without need for use of significant applied torque and normal forces. Because the release layer has a low melting point that affords easy separation from the adhesive layer, both component delaminations and the partial reflow or melting of solder joints on adjacent components are eliminated from the heatsink removal process.

BEST MODE FOR CARRYING OUT THE INVENTION

Figure 1:
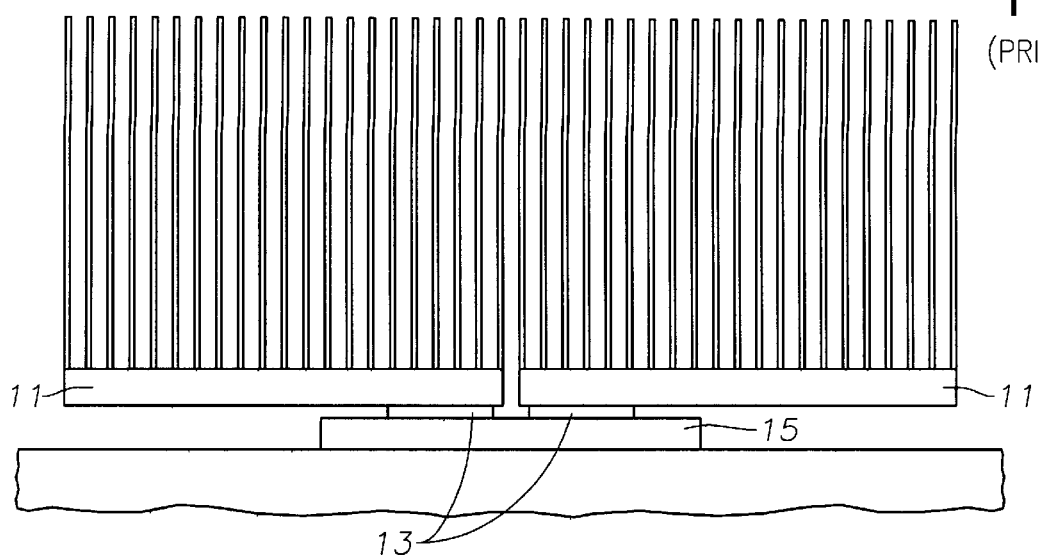
FIG. 1 is a side view of a prior art heatsink configuration for an MCM.
Figure 2:
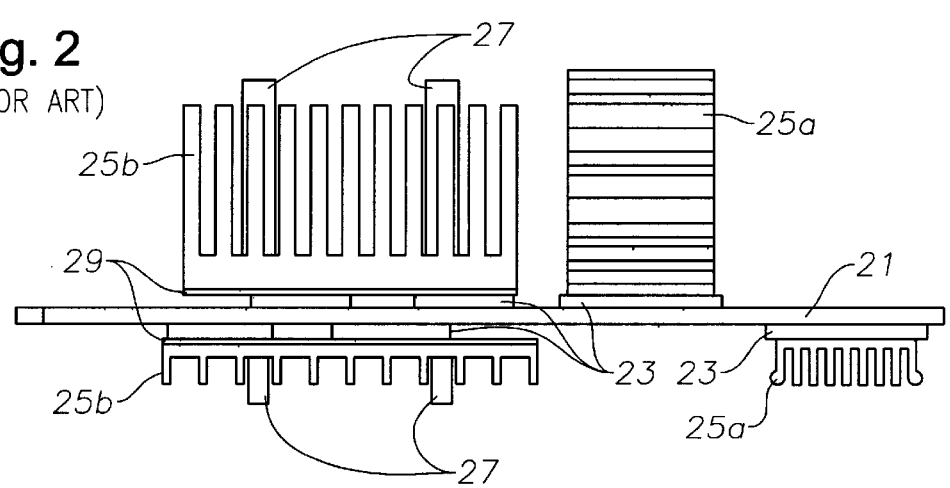
FIG. 2 is a side view-of a prior art heatsink configurations for modules and PCBs.
Figure 3:
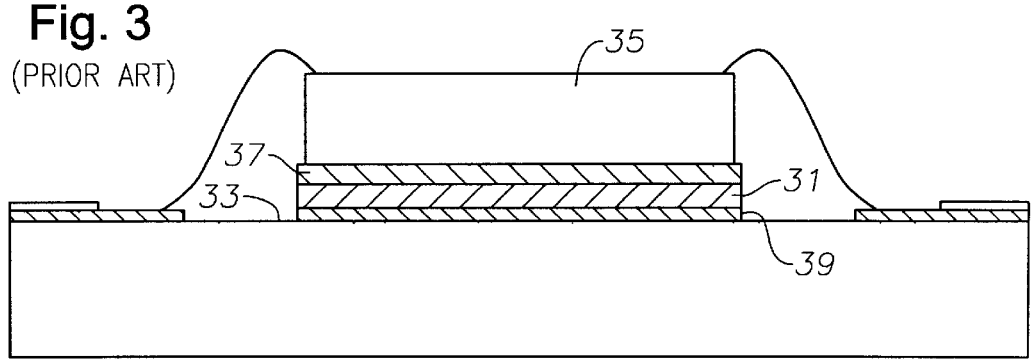
FIG. 3 is a sectional side view of a prior art interconnect method for reworking and replacing wirebonded chips attached to carrier surfaces.
Figure 4:
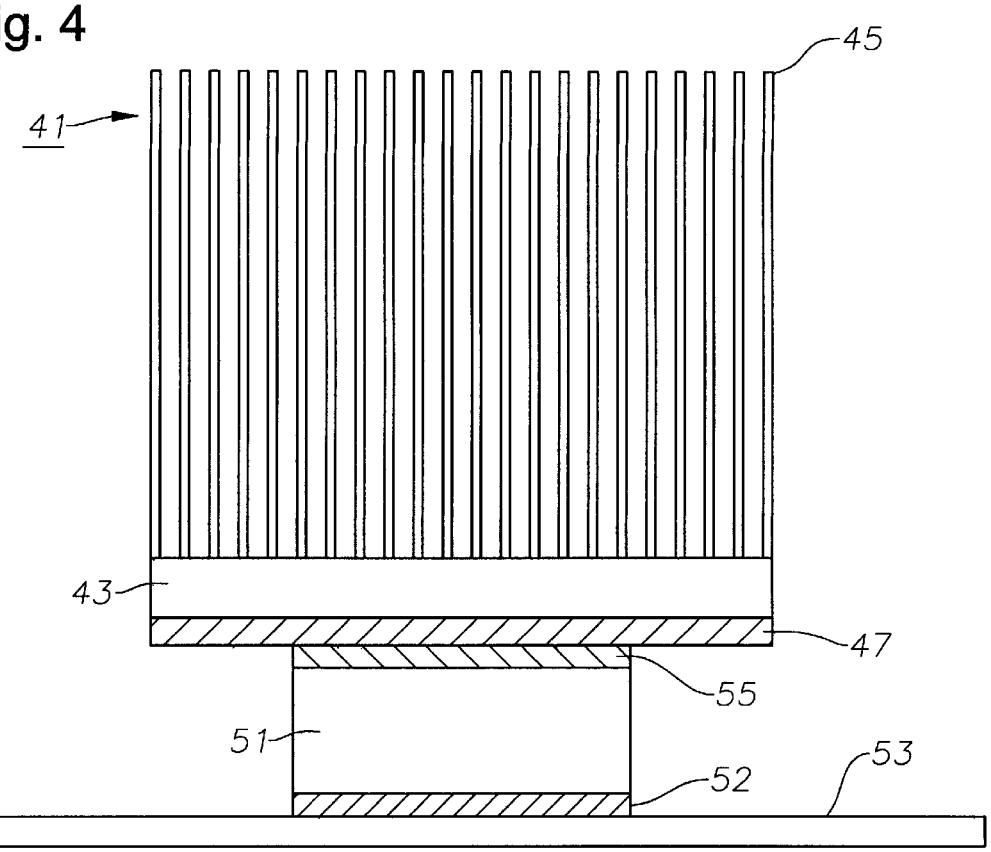
FIG. 4 is a partial sectional side view of a first embodiment of an interconnect apparatus and method for replacing heatsinks attached to an IC module and is constructed in accordance with the invention.

Referring to FIG. 4, a conventional high performance heatsink 41 having a base 43 and a heat dissipative feature 45. In the embodiment shown, heat dissipative feature 45 comprises a plurality of parallel fins extending from base 43. Heatsink 41 may be machined or extruded from aluminum having high thermal conductivity. Heatsink 41 also may be formed from a variety of materials including but not limited to metals, ceramics, or metal matrix composites.

Heatsink 41 is coated or plated with a solderable layer of electroless or electrolytic plating such as nickel, nickel-phosphorus, nickel-boron, copper or silver. The plating may also comprise a nickel-based plating with one of a variety of thin solderable overplate layers such as tin, a tin-lead alloy, indium, copper, silver, palladium or gold. After heatsink 41 is plated with one or more of these layers, a solder release layer 47 is formed on an outer surface of base 43. Release layer 47 is a relatively thick coating (1 to 150 microns) of alloy 532. Alloy 532 is a designation for a tin-lead-indium solder alloy which has an approximate composition of 54% tin by weight, 26% lead by weight, and 20% indium by weight. For use with this invention, the alloy 532 material may possess an allowable compositional variation of plus to minus 5 weight percent from the nominal compositions of the three elements comprising the alloy. Release layer 47 may be applied using many varieties of fluxing and soldering methods including wave solder processes, hot air solder levelling (HASL) processes, solder fountain processes, molten solder squeegee processes, solder paste screen printing and subsequent solder paste deposit reflow processes, solder paste stencil printing and subsequent solder paste deposit reflow processes, and manual application processes that require use of a soldering iron equipped with an appropriate blade shaped tool head. After the solder is applied using one of these methods, heatsink 41 is then cleaned and dried prior to use. Although a variety of solder deposition methods can be used, both thickness and thickness variation of the resultant solder deposit layer can vary to a significant extent depending upon the solder application process used. In heatsink applications where deposit flatness is critical, solder layers deposited using some methods listed above may also require secondary flattening processes to ensure that a sufficiently even, flat, and planar solder layer is formed.

Alloy 532 has two important characteristics which are essential for structural reliability and reworkability when it is used with soldered components. First, it has a relatively high concentration of indium (approximately 20% by weight). This facilitates formation of a stable indium or indium-tin oxide layer on the surface of release layer 47. The oxide layer on release layer 47 is essential for providing superior adhesive bonds with conventional compliant attach adhesives that are used to affix heatsinks to module packages.

Another critical property of alloy 532 is its melting point. When alloyed with the various solderable platings listed above, alloy 532 has a melting range of approximately 125 to 160 degrees C. This relatively low melting range avoids component and card solder pad delaminations and the partial reflow or melting of solder joints on adjacent components. As a result, alloy 532 is compatible with both module operational requirements and heatsink removal temperature requirements. Other solder alloys which have the essential oxide formation capability and a melting range within 120 to 160 degrees C., are also recommended. In applications where sensitivity to solder pad delaminations or the partial reflow and melting of solder joints on adjacent components is not an issue, other fusible materials such as conventional solders with higher melting points are recommended.

In operation, individual or array heatsinks 41 are interconnected to the surfaces of one or more IC modules or chips 51 (one shown). The modules 51 are soldered or socketed to the PCB 53 at an interconnection area 52 to provide electrical interconnection. For modules 51 that are electrically interconnected to PCBs via soldering methods, heatsinks 41 must be attached to the module or chip surfaces after they are joined to the PCB. However, for modules 51 which are joined via socketing or other nonsensitive interconnection means, heatsinks 41 can be attached to the module or chip surfaces either before or after the modules 51 are integrated with the PCB. Heatsink 41 is attached with a layer 55 of mechanically compliant, thermally conductive adhesive using conventional manufacturing processes.

In the event that heatsink 41 needs to be removed to repair or rework module(s) 51, card 53, or other components present on card 53, local heat is applied to melt release layer 47. After release layer 47 liquifies, heatsink 41 is easily removed from module 51 with minimal effort. The liquid interface provided by release layer 47 during rework significantly reduces the mechanical forces required to remove heatsink 41 from module 51. Since release layer 47 effectively debonds from adhesive layer 55, negligible cleaning of the surface of heatsink 41 is required to reuse it. Module 51 may also be reused after a conventional manufacturing reclaim adhesive cleaning.

Figure 5:
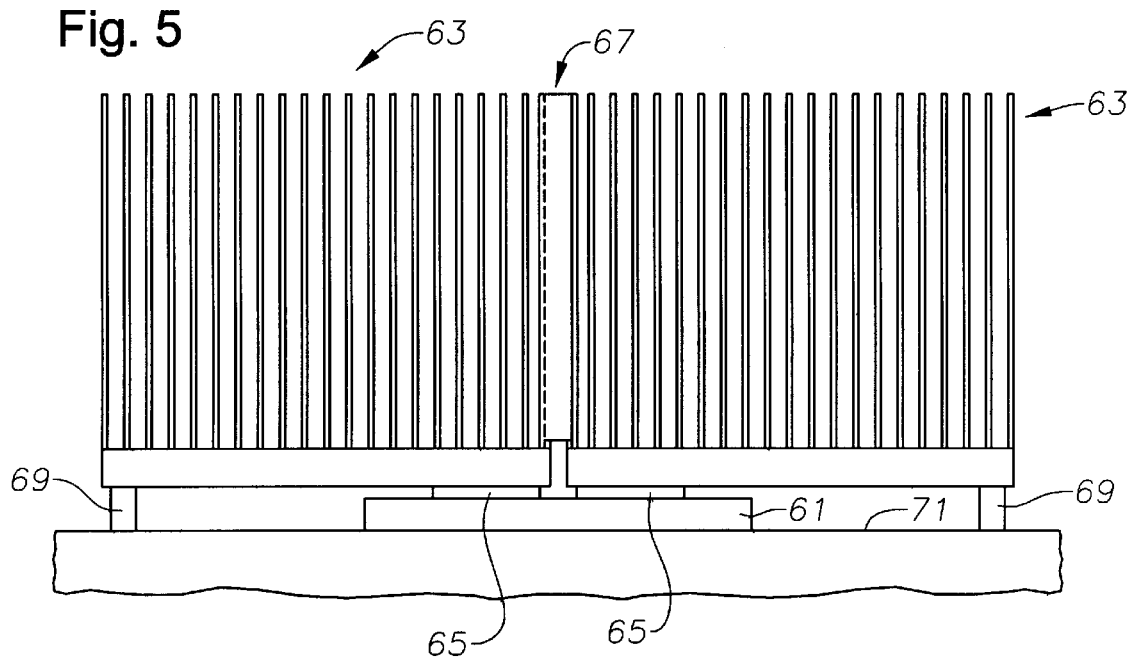
FIG. 5 is a side view of a second embodiment of the apparatus of FIG. 4 for replacing heatsinks attached to an MCM.

Since negligible torque is required to remove close proximity heatsinks 41 from module or chip surfaces, the invention may also be adapted for use on MCMs, as shown in FIG. 5 for the dual chip module 61. In this embodiment, two heatsinks 63 are required to ensure consistent cooling performance, packaging strain relief, and enhanced electrical characteristics. Heatsinks 63 are formed in an essentially identical manner to heatsink 41 and are individually joined to chips 65 in the same manner that heatsink 41 is joined to module 51.

To facilitate both placement and positioning of heatsinks 63 during their initial attachment and their subsequent removal during rework and repair operations, heatsinks 63 can also be provided with a suitable keying device, such as a vertical dovetail 67, on their adjacent surfaces. Since heatsinks 63 may overhang the module by a significant distance, a strain relief can also be incorporated into the heatsink interconnect design and used to ensure even contact between the heatsinks and the module IC chips, minimize risk of damage during assembly handling, and minimize presence of stresses that can arise on the heatsink to module bond interfaces when it is necessary to integrate aggregate card, module, and heatsink assemblies into system enclosures at various orientations. One example of a strain relief is stand-offs 69 located between the overhanging edges of the heatsinks and the card surface 71. In addition, heatsinks 63 can also be grounded to provide improved electrical noise performance and guard against ESD damage. Grounding may be provided by numerous other devices instead of stand-offs 69.

The invention has several advantages. The apparatus and method disclosed allow for production of low cost, high performance heatsinks that are easily manufactured and provide effective reworkability and rework temperature compatibility with all module and board materials and packaging configurations. This design is compatible with existing heatsink attachment adhesives and does not require potentially damaging heatsink torque or tensile force removal processes. Unlike prior art attachment methods, this design does not require board pin holes and is relatively inexpensive.

While the invention has been shown or described in only some of its forms, it should be apparent to those skilled in the art that it is not so limited, but is susceptible to various changes without departing from the scope of the invention.

We claim:

1. A heatsink for at least one electrical component mounted on an electronics card, comprising:
    a metal base having a plurality of heat dissipation features extending therefrom;
    a solder layer deposited on the base; and wherein
    the solder layer of the base is adapted to be bonded to a component with a thermally conductive adhesive, such that the base may be removed from the component by melting the solder layer.

2. The heatsink of claim 1 wherein the solder layer has a thickness in the range of 1 to 150 microns.

3. The heatsink of claim 1 wherein the solder layer is formed from an alloy that is approximately 20% indium by weight.

4. The heatsink of claim 1 wherein the solder layer is formed from a tin-lead-indium alloy.

5. The heatsink of claim 1, further comprising an indium-tin oxide on a surface of the solder layer.

6. The heatsink of claim 1 wherein the solder layer has a melting point in the range of approximately 125 to 160 degrees C.

7. The heatsink of claim 1 wherein the heat dissipation features comprise parallel fins.

8. The heatsink of claim 1, further comprising a solderable material plated on the base beneath the solder layer.

9. The heatsink of claim 8 wherein the solderable material is selected from the group consisting of nickel, nickel-phosphorus, nickel-boron, copper, and silver.

10. The heatsink of claim 8 wherein the solderable material comprises a nickel-based plating with a solderable overplate layer selected from the group consisting of tin, tin-lead, indium, copper, silver, palladium and gold.

11. The heatsink of claim 1 wherein the solder layer of the base is adapted to be bonded to a plurality of components with the thermally conductive adhesive, such that the base may be removed from the plurality of components by melting the solder layer.

12. An apparatus, comprising in combination:
    an electronics card;
    an electrical component mounted on and electrically connected to the card;
    a metal heatsink having a base with a plurality of heat dissipation features extending therefrom;
    a solder layer deposited on the base; and wherein
    the solder layer on the base is bonded to the component with a thermally conductive adhesive, such that the base may be removed from the component by melting the solder layer.

13. The apparatus of claim 12 wherein the solder layer has a thickness in the range of 1 to 150 microns.

14. The apparatus of claim 12 wherein the solder layer is formed from an alloy that is approximately 20% indium by weight.

15. The apparatus of claim 12 wherein the solder layer is formed from a tin-lead-indium alloy.

16. The apparatus of claim 12, further comprising an indium-tin oxide on a surface of the solder layer.

17. The apparatus of claim 12 wherein the solder layer has a melting point in the range of approximately 125 to 160 degrees C.

18. The apparatus of claim 12 wherein the heat dissipation features comprise parallel fins.

19. The apparatus of claim 12, further comprising a solderable material plated on the heatsink beneath the solder layer.

20. The apparatus of claim 19 wherein the solderable material is selected from the group consisting of nickel, nickel-phosphorus, nickel-boron, copper, and silver.

21. The apparatus of claim 19 wherein the solderable material comprises a nickel-based plating with a solderable overplate layer selected from the group consisting of tin, tin-lead, indium, copper, silver, palladium and gold.

22. The apparatus of claim 12 wherein:
the electrical component comprises a plurality of electrical components mounted on and electrically connected to the card;
the heatsink comprises a plurality of heatsinks, each having a base with a solder layer and a plurality of heat dissipation features extending therefrom; and wherein
each of the bases is bonded to at least one of the components with the thermally conductive adhesive, such that each of the bases may be removed from their respective components by melting their respective solder layers.

23. A heat dissipation device for a module having a plurality of electrical components, the module being mounted on an electronics card, comprising:
a plurality of metal heatsinks, each having a base with a plurality of heat dissipation features extending therefrom;
a solder layer plated on each of the bases; and wherein
each of the solder layers of the bases is adapted to be bonded to at least one electrical component with a thermally conductive adhesive, such that each of the bases may be independently removed from its respective component by melting its respective solder layer.

24. The heat dissipation device of claim 23 wherein each of the solder layers has a thickness in the range of 1 to 150 microns.

25. The heat dissipation device of claim 23 wherein the solder layers are formed from an alloy that is approximately 20% indium by weight.

26. The heat dissipation device of claim 23 wherein the solder layers are formed from a tin-lead-indium alloy.

27. The heat dissipation device of claim 23, further comprising an indium-tin oxide on a surface of each of the solder layers.

28. The heat dissipation device of claim 23 wherein the solder layers have a melting point in the range of approximately 125 to 160 degrees C.

29. The heat dissipation device of claim 23 wherein the heat dissipation features comprise parallel fins.

30. The heat dissipation device of claim 23, further comprising a solderable material plated on the heatsinks beneath their respective solder layers.

31. The heat dissipation device of claim 30 wherein the solderable material is selected from the group consisting of nickel, nickel-phosphorus, nickel-boron, copper, and silver.

32. The heat dissipation device of claim 30 wherein the solderable material comprises a nickel-based plating with a solderable overplate layer selected from the group consisting of tin, tin-lead, indium, copper, silver, palladium and gold.

33. The heat dissipation device of claim 23, further comprising interlocking features on each of the heatsinks for interlocking the heatsinks together to facilitate placement and positioning of the heatsinks during their initial attachment and their subsequent removal.

34. The heat dissipation device of claim 23, further comprising a strain relief for each of the heatsinks, each of the strain reliefs being adapted to be mounted between its respective heatsink and the card.

35. The heat dissipation device of claim 34 wherein each of the strain reliefs comprises a stand-off.

* * * * *